United States Patent
Matsui (10) Patent No.: US 12,406,854 B2
(45) Date of Patent: Sep. 2, 2025

(54) DRY ETCHING METHOD, PRODUCTION METHOD FOR SEMICONDUCTOR ELEMENT, AND CLEANING METHOD

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 248 days.

(21) Appl. No.: 17/595,585

(22) PCT Filed: Feb. 8, 2021

(86) PCT No.: PCT/JP2021/004579
§ 371 (c)(1),
(2) Date: Nov. 19, 2021

(87) PCT Pub. No.: WO2021/171986
PCT Pub. Date: Sep. 2, 2021

(65) Prior Publication Data
US 2022/0230888 A1  Jul. 21, 2022

(30) Foreign Application Priority Data
Feb. 26, 2020  (JP) ................... 2020-030984

(51) Int. Cl.
*C23F 1/12* (2006.01)
*B08B 9/08* (2006.01)
(Continued)

(52) U.S. Cl.
CPC .......... *H01L 21/31122* (2013.01); *B08B 9/08* (2013.01); *H01L 21/32135* (2013.01);
(Continued)

(58) Field of Classification Search
None
See application file for complete search history.

(56) References Cited

U.S. PATENT DOCUMENTS 3,095,332 A  6/1963 Ligenza
4,498,953 A  2/1985 Cook et al.
(Continued)

FOREIGN PATENT DOCUMENTS

JP  2001-267241 A  9/2001
JP  2008-536312 A  9/2008
(Continued)

OTHER PUBLICATIONS

International Search Report dated Apr. 6, 2021 in Application No. PCT/JP2021/004579.

*Primary Examiner* — Shamim Ahmed
(74) *Attorney, Agent, or Firm* — Sughrue Mion, PLLC (57) ABSTRACT

A dry etching method which includes a dry etching step in which an etching gas containing a halogen fluoride, which is a compound of bromine or iodine and fluorine, is brought into contact with a member to be etched (12) having an etching object, which is an object to be etched by the etching gas, thereby etching the etching object without using plasma. The etching object contains at least one metal selected from among titanium, indium, and tin. Also disclosed is a production method for manufacturing a semiconductor element using the dry etching method as well as a cleaning method for cleaning an inner surface of a chamber of a semiconductor element manufacturing apparatus using the dry etching method.

15 Claims, 2 Drawing Sheets

(51) Int. Cl.
   *H01L 21/311*     (2006.01)
   *H01L 21/3213*    (2006.01)
(52) U.S. Cl.
   CPC ..... *B08B 2209/08* (2013.01); *H01L 21/31144* (2013.01); *H01L 21/32139* (2013.01)

(56) References Cited

U.S. PATENT DOCUMENTS

| | | |
|---|---|---|
| 5,565,038 A | 10/1996 | Ashley |
| 6,207,570 B1 | 3/2001 | Mucha |
| 10,043,674 B1 * | 8/2018 | Korolik ............. H01J 37/32422 |
| 11,434,565 B2 | 9/2022 | Takahashi et al. |
| 2006/0226122 A1 | 10/2006 | Wojtczak et al. |
| 2010/0154835 A1 | 6/2010 | Dimeo et al. |
| 2017/0200602 A1 * | 7/2017 | Kikuchi .................. H01L 31/18 |
| 2019/0112705 A1 | 4/2019 | Takahashi et al. |
| 2019/0287808 A1 * | 9/2019 | Goradia ............ H01J 37/32422 |
| 2019/0355590 A1 | 11/2019 | Suzuki et al. |

FOREIGN PATENT DOCUMENTS

| | | |
|---|---|---|
| JP | 2010-503977 A | 2/2010 |
| KR | 10-2018-0132670 A | 12/2018 |

* cited by examiner

FIG. 3

DRY ETCHING METHOD, PRODUCTION METHOD FOR SEMICONDUCTOR ELEMENT, AND CLEANING METHOD

CROSS REFERENCE TO RELATED APPLICATIONS

This application is a National Stage of International Application No. PCT/JP2021/004579 filed Feb. 8, 2021, claiming priority based on Japanese Patent Application No. 2020-030984 filed Feb. 26, 2020.

TECHNICAL FIELD

The present invention relates to a dry etching method, a production method for a semiconductor element, and a cleaning method.

BACKGROUND ART

Materials containing metals such as titanium (Ti), indium (In), and tin (Sn) are used as hard masks or electrode materials for semiconductor elements in some cases. To use materials containing the metals as semiconductor element materials, a technology for microfabricating the materials containing the metals into desired shapes is required, whereas many of the materials containing the metals are difficult-to-etch materials having almost no vapor pressure.

Therefore, microfabrication by a wet etching method, in which the materials containing the metals are removed by bringing a solution containing an oxidant, a chelating agent, a fluoride ion, or the like into contact with the materials containing the metals, has conventionally been a mainstream method (refer to, for example, PTL 1).

However, there has been a risk in that, if the wet etching method is adopted for the process of etching a semiconductor element, even a portion of the semiconductor element that should not be etched is inconveniently etched, resulting in loss of the characteristics of the semiconductor element.

Meanwhile, there are known methods for removing materials constituting semiconductor elements from the surfaces of the semiconductor elements, the inner surfaces of chambers of semiconductor element manufacturing apparatuses, and the like by dry etching methods. For example, PTL 2 discloses a method for removing metal deposits accumulating on the inner surface of a chamber due to the processing for the production of semiconductor elements. The method disclosed in PTL 2 is a method in which a halogen simple substance gas other than a fluorine gas and a fluorine gas are simultaneously supplied into the chamber of a semiconductor element manufacturing apparatus to generate halogen fluoride in the chamber, and an etching gas containing this halogen fluoride is brought into contact with the metal deposits thereby to remove the metal deposits.

However, the method disclosed in PTL 2 has been presenting a problem in that producing the halogen fluoride requires a high temperature, resulting in a heavy load on the semiconductor element manufacturing apparatus. Further, the etching gas is a mixed gas of halogen fluoride and an unreacted halogen simple substance gas, so that there has been a risk in that a sufficient etching rate cannot be obtained.

CITATION LIST

Patent Literature

PTL 1: JP 2008-536312 A
PTL 2: JP 2001-267241 A

SUMMARY OF INVENTION

Technical Problem

An object of the present invention is to provide a dry etching method that enables selective etching of an etching object, which contains at least one metal selected from among titanium, indium, and tin, at a sufficient etching rate without using plasma, a production method for a semiconductor element, and a cleaning method.

Solution to Problem

To solve the above-described problems, one aspect of the present invention is as follows [1] to [11].

[1] A dry etching method including dry etching in which an etching gas containing a halogen fluoride, the halogen fluoride being a compound of bromine or iodine and fluorine, is brought into contact with a member to be etched having an etching object, the etching object being an object to be etched by the etching gas, to etch the etching object without using plasma, wherein the etching object contains at least one metal selected from among titanium, indium, and tin.

[2] The dry etching method according to [1], wherein the halogen fluoride is at least one selected from among bromine monofluoride, bromine trifluoride, bromine pentafluoride, iodine pentafluoride, and iodine heptafluoride.

[3] The dry etching method according to [1] or [2], wherein the etching gas is a mixed gas containing the halogen fluoride and an inert gas.

[4] The dry etching method according to any one of [1] to [3], wherein the content of a halogen simple substance gas contained in the etching gas is less than 5% by volume.

[5] The dry etching method according to any one of [1] to [4], wherein the dry etching is performed under a temperature condition of 40° C. to 250° C.

[6] The dry etching method according to any one of [1] to [4], wherein the dry etching is performed under a temperature condition of 80° C. to 150° C.

[7] The dry etching method according to any one of [1] to [6], wherein the dry etching is performed under a pressure condition of 1 Pa to 100 kPa.

[8] The dry etching method according to any one of [1] to [7],
wherein the member to be etched has a non-etching object, the non-etching object being not an object to be etched by the etching gas, and the etching object,
the non-etching object has at least one selected from among copper, nickel, cobalt, and photoresist, and
the etching object is selectively etched against the non-etching object.

[9] The dry etching method according to any one of [1] to [8], wherein the etching object is at least one selected from among a simple substance of the metal, an oxide of the metal, a nitride of the metal, an oxynitride of the metal, and an oxyfluoride of the metal.

[10] A production method for a semiconductor element for manufacturing a semiconductor element by using the dry etching method according to any one of [1] to [9], wherein the member to be etched is a semiconductor substrate having the etching object, and the production method includes processing in which at least a part of the etching object is removed from the semiconductor substrate by the etching.

[11] A cleaning method for cleaning an inner surface of a chamber of a semiconductor element manufacturing apparatus by using the dry etching method according to any one of [1] to [9], wherein the member to be etched is the chamber, the chamber has, on its inner surface, a deposit adhering due to an operation of the semiconductor element manufacturing apparatus, and the deposit is the etching object, and the cleaning method includes cleaning for removing the deposit from the inner surface of the chamber by the etching.

Advantageous Effects of Invention

According to the present invention, an etching object containing at least one metal element selected from among titanium, indium, and tin can be selectively etched at a sufficient etching rate without using plasma.

DESCRIPTION OF EMBODIMENTS

An embodiment of the present invention will be described below. The present embodiment illustrates an example of the present invention, and the present invention is not limited to the present embodiment. Further, various changes or improvements can be added to the present embodiment, and forms with such changes or improvements added thereto can be included in the present invention.

A dry etching method according to the present embodiment includes a dry etching step in which an etching gas containing halogen fluoride, which is a compound of bromine (Br) or iodine (I) and fluorine (F), is brought into contact with a member to be etched having an etching object, which is an object to be etched by an etching gas, to etch the etching object without using plasma. Further, the etching object contains at least one metal selected from among titanium (Ti), indium (In), and tin (Sn).

When the etching gas is brought into contact with the etching object, the halogen fluoride in the etching gas reacts with the metal in the etching object, thus generating a fluoride of the metal. The fluoride of the metal has volatility, so that the etching of the etching object progresses as the fluoride of the metal volatilizes.

Consequently, the dry etching method according to the present embodiment makes it possible to selectively etch, at a sufficient etching rate, an etching object containing at least one metal selected from among titanium, indium, and tin without using plasma. In other words, an etching object can be selectively etched against a non-etching object, which is not an object to be etched by an etching gas. The non-etching object will be described in detail later.

Further, since the dry etching method according to the present embodiment enables an etching object to be etched without using plasma, there is no need to perform etching by using a costly plasma generator. This makes it possible to etch an etching object at low cost. In addition, since plasma is not used, corrosion is less likely to occur in the members (e.g., a chamber) constituting an etching apparatus, pipes connected to the etching apparatus, members (e.g., a chamber) constituting a semiconductor element manufacturing apparatus to be described later, and pipes connected to the semiconductor element manufacturing apparatus to be described later.

The dry etching method according to the present embodiment can be used for manufacturing semiconductor elements and cleaning the inner surface of a chamber of a semiconductor element manufacturing apparatus.

Specifically, the production method for a semiconductor element according to the present embodiment is a semiconductor element production method for manufacturing semiconductor elements by using the dry etching method according to the present embodiment, a member to be etched is a semiconductor substrate having the etching object, and the production method includes a processing step of removing at least a part of the etching object from the semiconductor substrate by etching.

The following is an example of the production method for a semiconductor element according to the present embodiment. The production method of this example includes a film formation step in which a layer composed of an etching object is formed on the surface of a semiconductor substrate, a mask formation step in which a mask having a predetermined pattern is formed on the layer of the etching object, and a processing step in which the layer of the etching object on which the mask has been formed is etched by the dry etching method of the present embodiment. A portion of the layer of the etching object that is not covered by the mask is removed by the processing step, so that the above-mentioned pattern is transferred to the layer of the etching object, and a semiconductor element is thus obtained.

Further, the cleaning method according to the present embodiment is a cleaning method for cleaning the inner surface of a chamber of a semiconductor element manufacturing apparatus by using the dry etching method according to the present embodiment, and the member to be etched is the chamber. The chamber has, on the inner surface thereof, deposits that have adhered as the semiconductor element manufacturing apparatus is operated, and the deposits are the etching object. Further, the cleaning method according to the present embodiment includes a cleaning step of removing the deposits from the inner surface of the chamber by etching.

For example, in the film formation step or the processing step in the example of the production method for a semiconductor element according to the present embodiment described above, there are cases where unwanted deposits composed of the etching object adhere to the inner surface of the chamber in which the film formation step and the processing step are performed. Therefore, if the cleaning step is performed at one or both of the timings after the film formation step is completed and after the processing step is completed, the deposits can be removed from the inner surface of the chamber by etching.

The following will describe in more detail the dry etching method, the production method for a semiconductor element, and the cleaning method according to the present embodiment.

[Halogen Fluoride]

Although the type of halogen fluoride is not particularly limited as long as it is a compound of bromine or iodine and fluorine, at least one selected from among bromine monofluoride (BrF), bromine trifluoride ($BrF_3$), bromine pentafluoride ($BrF_5$), iodine pentafluoride ($IF_5$), and iodine heptafluoride ($IF_7$) is preferable. Among these halogen fluorides, at least one selected from bromine pentafluoride and iodine heptafluoride is more preferable from the viewpoint of ease of handling and availability.

[Etching Gas]

An etching gas is a gas containing halogen fluoride. The etching gas may be a gas composed of only halogen fluoride, or a mixed gas containing halogen fluoride and another type of gas. If the etching gas is composed of a mixed gas containing halogen fluoride and another type of gas, then the content of the halogen fluoride contained in the etching gas is preferably 1% by volume or more, more preferably 5% by volume or more, and even more preferably 10% by volume or more to etch an etching object at a sufficient etching rate.

If the etching gas is a mixed gas containing halogen fluoride and another type of gas, an inert gas can be used as another type of gas. In other words, the etching gas may be a mixed gas composed of halogen fluoride and an inert gas. As the inert gas, at least one selected from among nitrogen gas ($N_2$), helium (He), neon (Ne), argon (Ar), krypton (Kr), and xenon (Xe) can be used. The content of an inert gas contained in the etching gas is not particularly limited, but may be more than 0% by volume and 90% by volume or less.

The etching gas may contain halogen simple substance gas, i.e., fluorine gas ($F_2$), chlorine gas ($Cl_2$), bromine gas ($Br_2$), iodine gas ($I_2$), and the like. However, in order to etch an etching object at a sufficient etching rate, the content of the halogen simple substance gas contained in the etching gas is preferably as low as possible. Specifically, the content of the halogen simple substance gas contained in the etching gas is preferably less than 5% by volume, more preferably 1% by volume or less, and even more preferably 1000 ppm by volume or less.

[Temperature Condition of the Dry Etching Step]

The temperature condition of the dry etching step in the dry etching method according to the present embodiment is not particularly limited as long as the halogen fluoride can be present in a gaseous state at a pressure during etching, but is preferably 40° C. to 250° C., more preferably 45° C. or more to less than 250° C., even more preferably 50° C. to 200° C. Here, the temperature of the temperature condition is the temperature of a member to be etched, and the temperature of a stage in a chamber of an etching apparatus can also be used.

If the temperature condition is 40° C. or more, then the halogen fluoride can remain in a gaseous state, and the etching rate of an etching object is likely to become higher. On the other hand, setting the temperature condition to 250° C. or less is advantageous in that, for example, the etching can be performed without requiring excessive time and energy, the load on an etching apparatus and a semiconductor element manufacturing apparatus is small, and the etching of a portion that should not be etched (e.g., the non-etching object to be described later) can be suppressed.

[Pressure Condition of the Dry Etching Step]

The pressure condition of the dry etching step in the dry etching method according to the present embodiment is not particularly limited as long as halogen fluoride can be present in a gaseous state at a pressure during etching, but is preferably 1 Pa to 100 kPa, more preferably 1 kPa to 90 kPa, even more preferably 2 kPa to 80 kPa, and particularly preferably 5 kPa to 50 kPa. The flow rate of an etching gas may be appropriately set so that the pressure in a chamber is maintained constant according to the size of the chamber or the capacity of an exhaust system that depressurizes the inside of the chamber.

[Etching Object]

An etching object to be etched by an etching gas contains at least one metal selected from among titanium, indium, and tin, and may be a simple substance of the metal or a compound of the metal. Alternatively, the etching object may be a mixture containing at least one of the simple substance of the metal and the compound of the metal.

Examples of a mixture containing at least one of the simple substance of the metal and a compound of the metal include an alloy of the metal and another metal, a mixture of at least one of the simple substance of the metal and a compound of the metal with a different type of material, and a mixture of at least one of the simple substance of the metal and a compound of the metal and an impurity. These mixtures preferably contain a total of 10 mol % or more, more preferably 20 mol % or more, and even more preferably 30 mol % or more of the simple substance of the metal and the compound of the metal.

Examples of the compound of the metal include an oxide of the metal, a nitride of the metal, an oxynitride of the metal, and an oxyfluoride of the metal. The oxide of the metal, the nitride of the metal, the oxynitride of the metal, and the oxyfluoride of the metal mean the compound composed of the metal and oxygen atoms (O), the compound composed of the metal and nitrogen atoms (N), the compound composed of the metal, oxygen atoms, and nitrogen atoms, and the compound composed of the metal, oxygen atoms, and fluorine atoms, respectively. The oxides of the metal, the nitrides of the metal, the oxynitrides of the metal, and the oxyfluorides of the metal are not particularly limited in terms of form, and may be in the form of, for example, film, foil, powder, particle, or lump.

The ratio of the metal to oxygen atoms, nitrogen atoms, and fluorine atoms in a compound of the metal is not particularly limited, but an oxide of the metal is a compound represented by, for example, $M_xO_y$ (M denoting at least one metal selected from among titanium, indium, and tin, and x and y each independently denoting an integer of 1 or more), and is a compound containing preferably 10 mol % or more, more preferably 15 mol % or more, and even more preferably 20 mol % or more of the metal. Specifically, examples of the compound include compounds represented by MO, $M_2O_3$, $MO_2$, $MO_3$, $M_3O_4$, and $M_2O_5$.

A nitride of the metal is a compound represented by, for example, $M_aN_b$ (M denoting at least one metal selected from among titanium, indium, and tin, and a and b each independently denoting an integer of 1 or more), and is a compound containing preferably 10 mol % or more, more preferably 15 mol % or more, and even more preferably 20 mol % or more of the metal. Specifically, examples of the compound include compounds represented by MN, $M_2N$, $M_3N_2$, $M_3N_4$, $M_4N$, $M_7N_3$, and $M_{16}N_2$.

An oxynitride of the metal is a compound represented by, for example, $M_cN_dO_e$ (M denoting at least one metal selected from among titanium, indium, and tin, and c, d, and e each independently denoting an integer of 1 or more), and is a compound containing preferably 10 mol % or more, more preferably 15 mol % or more, and even more preferably 20 mol % or more of the metal.

An oxyfluoride of the metal is a compound represented by, for example, $M_fF_gO_h$ (M denoting at least one metal selected from among titanium, indium, and tin, and f, g, and h each independently denoting an integer of 1 or more), and is a compound containing preferably 10 mol % or more, more preferably 15 mol % or more, and even more preferably 20 mol % or more of the metal.

A halogen fluoride in an etching gas, e.g., a bromine pentafluoride gas, reacts with an etching object containing at least one metal selected from among titanium, indium, and tin at a predetermined reaction temperature to produce a reaction product presumed to be a fluoride or the like of the metal. The estimated structure of the fluoride of the metal differs depending on the combination of a halogen fluoride and an etching object, and $M_qF_r$ or $M_qO_sF_t$, for example, can be considered. It should be noted that M denotes at least one metal selected from among titanium, indium, and tin, and q, r, s, and t each independently denotes an integer of 1 or more. The fluoride of the metal is volatilized and removed under a temperature condition and a pressure condition in etching due to a higher vapor pressure thereof, as compared with the simple substance of the metal, an oxide of the metal, a nitride of the metal, an oxynitride of the metal, and the like.

[Non-Etching Object]

The etching of a non-etching object that has at least one selected from among copper, nickel, cobalt, and photoresist hardly progresses because the reaction with halogen fluoride is extremely slow or the vapor pressure of a reaction product generated by the reaction with the halogen fluoride is low.

Therefore, when a member to be etched having an etching object and a non-etching object is etched using the dry etching method according to the present embodiment, the etching object can be selectively etched against the non-etching object. Therefore, the etching method according to the present embodiment can be used for a method of, for example, processing an etching object into a predetermined shape (e.g., processing a film-like etching object of a member to be etched to a predetermined film thickness) by using a patterned non-etching object as a mask, thus enabling the etching method according to the present embodiment to be suitably used in the production of semiconductor elements. In addition, since a non-etching object is not etched, the etching of portions of a semiconductor element that should not be etched can be suppressed, thus making it possible to prevent the loss of the characteristics of the semiconductor elements that would be caused by the etching.

A photoresist means a photosensitive composition whose physical properties, including solubility, are changed by light, an electron beam, or the like. Examples include photoresists for g-line, h-line, i-line, KrF, ArF, $F_2$, and EUV. There is no particular restriction on the composition of the photoresist as long as the composition is generally used in semiconductor production processes, and examples include compositions containing a polymer synthesized from at least one monomer selected from among chain olefins, cyclic olefins, styrene, vinyl phenol, (meth) acrylic acid, (meth) acrylate, epoxy, melamine, and glycol. The (meth) acrylic acid means one or both of acrylic acid and methacrylic acid, and (meth) acrylate means one or both of acrylate and methacrylate.

Figure 1:
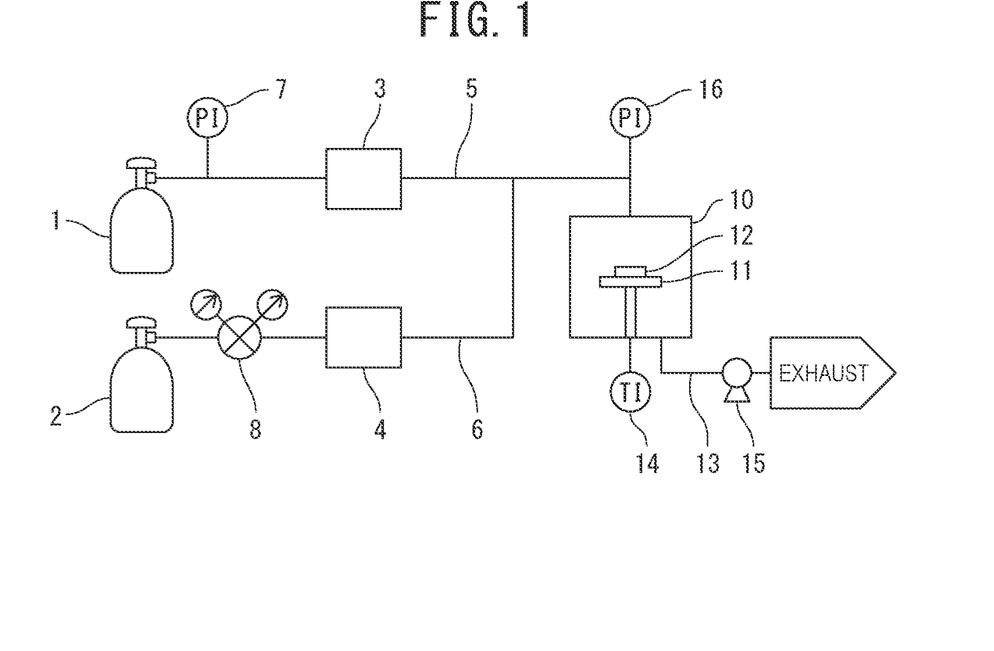
FIG. 1 is a schematic diagram of an example of an etching apparatus illustrative of an embodiment of the dry etching method in accordance with the present invention.

Referring now to FIG. 1, an example of the configuration of an etching apparatus with which the etching method according to the present embodiment can be implemented, and an example of the dry etching method that uses the etching apparatus will be described. The etching apparatus of FIG. 1 is a plasmaless etching apparatus that does not use plasma. First, the etching apparatus of FIG. 1 will be described.

The etching apparatus of FIG. 1 includes a chamber 10 in which etching is performed, a stage 11 that supports a member to be etched 12, which is to be etched, inside the chamber 10, a thermometer 14 that measures the temperature of the member to be etched 12, an exhaust pipe 13 for discharging a gas inside the chamber 10, a vacuum pump 15 provided on the exhaust pipe 13 to depressurize the inside of the chamber 10, and a pressure gauge 16 that measures the pressure inside the chamber 10.

The etching apparatus of FIG. 1 further includes an etching gas supply unit that supplies an etching gas into the chamber 10. This etching gas supply unit has a halogen fluoride gas supply unit 1 that supplies a halogen fluoride gas, an inert gas supply unit 2 that supplies an inert gas, a halogen fluoride gas supply pipe 5 that connects the halogen fluoride gas supply unit 1 and the chamber 10, and an inert gas supply pipe 6 that connects the inert gas supply unit 2 to a middle part of the halogen fluoride gas supply pipe 5.

Further, the halogen fluoride gas supply pipe 5 is provided with a pressure gauge 7 that measures the pressure of a halogen fluoride gas, and a halogen fluoride gas flow rate control unit 3 that controls the flow rate of a halogen fluoride gas. In addition, the inert gas supply pipe 6 is provided with an inert gas pressure control unit 8 that controls the pressure of an inert gas, and an inert gas flow rate control unit 4 that controls the flow rate of an inert gas.

Further, to supply the halogen fluoride gas as the etching gas to the chamber 10, the halogen fluoride gas is fed out from the halogen fluoride gas supply unit 1 to the halogen fluoride gas supply pipe 5, thereby supplying the halogen fluoride gas to the chamber 10 through the halogen fluoride gas supply pipe 5.

Further, to supply a mixed gas of a halogen fluoride gas and an inert gas as the etching gas, the halogen fluoride gas is fed out from the halogen fluoride gas supply unit 1 to the halogen fluoride gas supply pipe 5 and the inert gas is fed out from the inert gas supply unit 2 to the halogen fluoride gas supply pipe 5 through the inert gas supply pipe 6. Thus, the halogen fluoride gas and the inert gas are mixed to form a mixed gas at the middle part of the halogen fluoride gas supply pipe 5, and the mixed gas is supplied to the chamber 10 through the halogen fluoride gas supply pipe 5.

There is no particular restriction on the configurations of the halogen fluoride gas supply unit 1 and the inert gas supply unit 2, and for example, a tank or a cylinder may be used. In addition, as the halogen fluoride gas flow rate control unit 3 and the inert gas flow rate control unit 4, a mass flow controller or a flow meter, for example, can be used.

While supplying an etching gas to the chamber 10, the supply pressure (i.e., the value on the pressure gauge 7 in FIG. 1) of the etching gas is preferably maintained at a predetermined value. More specifically, the supply pressure of the etching gas is preferably 10 Pa to 1.0 MPa, more preferably 100 Pa to 0.5 MPa, and even more preferably 500 Pa to 0.3 MPa. If the supply pressure of the etching gas remains within the above range, the etching gas is smoothly supplied to the chamber 10 and the load on the components (e.g., the various units and the pipes) of the etching apparatus of FIG. 1 is small.

Further, the pressure of an etching gas supplied into the chamber 10 is preferably 1 Pa to 100 kPa, more preferably 1 kPa to 90 kPa, even more preferably 2 kPa to 80 kPa, and particularly preferably 5 kPa to 50 kPa from the viewpoint of uniformly etching the surface of the member to be etched 12. If the pressure of the etching gas in the chamber 10 is within the above range, the volatilization of the fluoride of the metal smoothly progresses, so that a sufficient etching rate is obtained and the etching speed ratio with respect to the non-etching object, i.e., the etching selectivity ratio, tends to be high.

The pressure in the chamber 10 before an etching gas is supplied is not particularly limited as long as the pressure is equal to or lower than the supply pressure of the etching gas, or lower than the supply pressure of the etching gas, but is preferably, for example, equal to or higher than $10^{-5}$ Pa and less than 100 kPa, and more preferably 1 Pa to 80 kPa.

The pressure difference between the supply pressure of an etching gas and the pressure in the chamber 10 before the etching gas is supplied is preferably 1.0 MPa or lower, more preferably 0.5 MPa or lower, and even more preferably 0.3 MPa or lower. If the pressure difference is within the above range, the etching gas is likely to be smoothly supplied into the chamber 10.

While an etching gas is being supplied into the chamber 10, the temperature of the etching gas is preferably maintained at a predetermined value. More specifically, the supply temperature of the etching gas is preferably 10° C. to 250° C.

The temperature of the member to be etched 12 during etching is preferably set to 40° C. to 250° C., more preferably equal to or more than 45° C. and less than 250° C., and even more preferably 50° C. to 200° C. Further, depending on the type of a non-etching object, or the like, there are cases where the temperature of the member to be etched 12 is preferably set to 80° C. to 150° C. Within this temperature range, the etching of the etching object of the member to be etched 12 is likely to smoothly progress, and the load on the etching apparatus is small, which tends to prolong the life of the etching apparatus.

The processing time of etching (hereinafter may be referred to also as "etching time") can be optionally set depending on how much the etching object of the member to be etched 12 is to be etched, but is preferably within 60 minutes, more preferably within 40 minutes, and even more preferably within 30 minutes in consideration of the production efficiency of a semiconductor element production process. The processing time of etching refers to the time from the introduction of an etching gas into the chamber 10 to the exhaustion of the etching gas inside the chamber 10 to finish the etching.

The dry etching method according to the present embodiment can be implemented using a general plasmaless etching apparatus used in a semiconductor element production process, such as the etching apparatus of FIG. 1, and the configuration of the etching apparatus that can be used is not particularly limited.

For example, the positional relationship between the halogen fluoride gas supply pipe 5 and the member to be etched 12 is not particularly limited as long as an etching gas can be brought into contact with the member to be etched 12. Further, as for the configuration of a temperature control mechanism for the chamber 10, the temperature control mechanism may be directly installed on the stage 11, or an external temperature controller may be used to heat or cool the chamber 10 from outside the chamber 10 as long as the temperature of the member to be etched 12 can be adjusted to any temperature.

In addition, the material of the etching apparatus of FIG. 1 is not particularly limited as long as the material is corrosion resistant to halogen fluoride to be used and allows depressurization to a predetermined pressure. For example, metals such as nickel, nickel-based alloys, aluminum, stainless steel, and platinum, ceramics such as alumina, or fluororesins, or the like can be used for portions to be in contact with an etching gas. Specific examples of the nickel-based alloys include Inconel (registered trademark), Hastelloy (registered trademark), and Monel (registered trademark). In addition, examples of fluororesins include polytetrafluoroethylene (PTFE), polychlorotrifluoroethylene (PCTFE), tetrafluoroethylene/perfluoroalkoxyethylene copolymer (PFA), polyvinylidene fluoride (PVDF), Teflon (registered trademark), Viton (registered trademark), and Kalrez (registered trademark).

Figure 2:
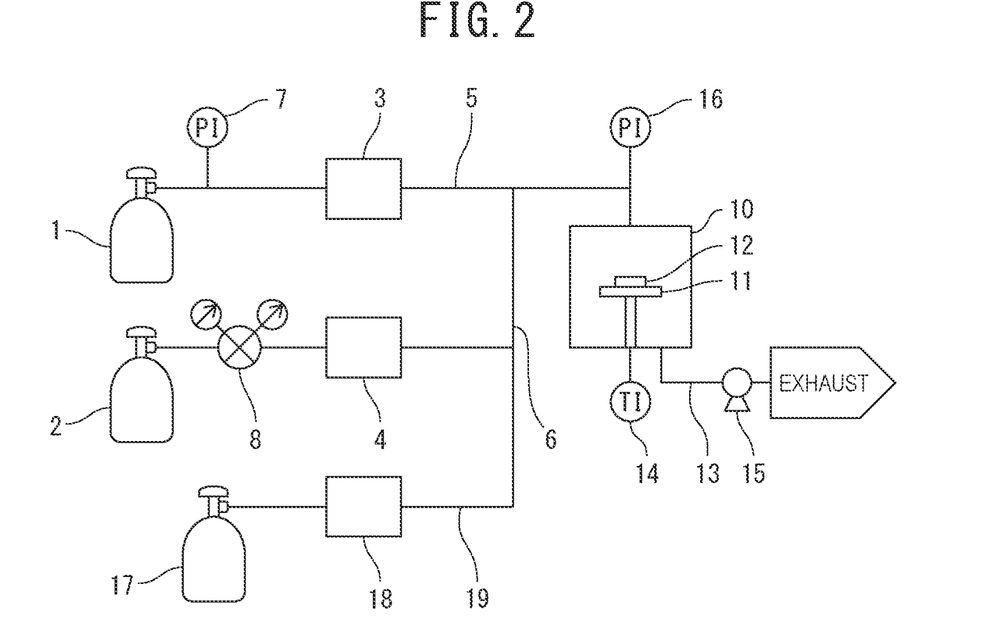
FIG. 2 is a schematic diagram of another example of an etching apparatus illustrative of an embodiment of the dry etching method in accordance with the present invention.

Further, as described above, an etching gas may contain halogen simple substance gas as long as the concentration thereof is less than 5% by volume, and when performing the etching with an etching gas containing the halogen simple substance gas, an etching apparatus illustrated in FIG. 2, for example, can be used. The etching apparatus illustrated in FIG. 2 will be described below. However, the configuration of the etching apparatus of FIG. 2 and the etching method using the etching apparatus of FIG. 2 are substantially the same as the case of the etching apparatus of FIG. 1, so that the descriptions of the same parts will be omitted and only the different parts will be described.

The etching apparatus of FIG. 2 includes an etching gas supply unit that supplies an etching gas into the chamber 10. The etching gas supply unit of the etching apparatus of FIG. 2 has the halogen fluoride gas supply unit 1 that supplies a halogen fluoride gas, the inert gas supply unit 2 that supplies an inert gas, a halogen simple substance gas supply unit 17 that supplies a halogen simple substance gas, the halogen fluoride gas supply pipe 5 that connects the halogen fluoride gas supply unit 1 and the chamber 10, the inert gas supply pipe 6 that connects the inert gas supply unit 2 to a middle part of the halogen fluoride gas supply pipe 5, and a halogen simple substance gas supply pipe 19 that connects the halogen simple substance gas supply unit 17 to a middle part of the inert gas supply pipe 6. The halogen simple substance gas supply pipe 19 is provided with a halogen simple substance gas flow rate control unit 18 that controls the flow rate of the halogen simple substance gas.

To supply a mixed gas of a halogen fluoride gas and a halogen simple substance gas as the etching gas, the halogen fluoride gas is fed out from the halogen fluoride gas supply unit 1 to the halogen fluoride gas supply pipe 5, and the halogen simple substance gas is fed out from the halogen simple substance gas supply unit 17 to the halogen fluoride gas supply pipe 5 through the halogen simple substance gas supply pipe 19 and the inert gas supply pipe 6. Thus, the halogen fluoride gas and the halogen simple substance gas are mixed to form a mixed gas at the middle part of the halogen fluoride gas supply pipe 5, and the mixed gas is supplied to the chamber 10 through the halogen fluoride gas supply pipe 5.

Similarly, to supply a mixed gas of a halogen fluoride gas, an inert gas, and a halogen simple substance gas as the etching gas, the halogen fluoride gas is fed out from the halogen fluoride gas supply unit 1 to the halogen fluoride gas supply pipe 5, the inert gas is fed out from the inert gas supply unit 2 to the halogen fluoride gas supply pipe 5 through the inert gas supply pipe 6, and further, the halogen simple substance gas is fed out from the halogen simple substance gas supply unit 17 to the halogen fluoride gas supply pipe 5 through the halogen simple substance gas supply pipe 19 and the inert gas supply pipe 6. Thus, the halogen fluoride gas, the inert gas, and the halogen simple substance gas are mixed to form the mixed gas at the middle part of the halogen fluoride gas supply pipe 5, and the mixed gas is supplied to the chamber 10 through the halogen fluoride gas supply pipe 5.

There is no particular restriction on the configuration of the halogen simple substance gas supply unit 17, and a tank or a cylinder, for example, may be used. In addition, as the halogen simple substance gas flow rate control unit 18, a mass flow controller or a flow meter, for example, can be used.

EXAMPLES

The following will describe the present invention in more detail, showing examples, comparative examples, and reference examples. The purities of the bromine pentafluoride and iodine heptafluoride used in the following examples, comparative examples, and reference examples were analyzed using a Fourier transform infrared spectrophotometer Nicolet iS5 manufactured by Thermo Fisher Scientific Corporation and a double-beam spectrophotometer U-2900 manufactured by Hitachi High-Tech Science Corporation, and it was confirmed that the purities were both 99% by mass or more.

Example 1-1

An etching object was etched by using an etching apparatus having substantially the same configuration as that of the etching apparatus of FIG. 1. A test piece (a member to be etched) used in Example 1-1 will be described with reference to FIG. 3.

Figure 3:
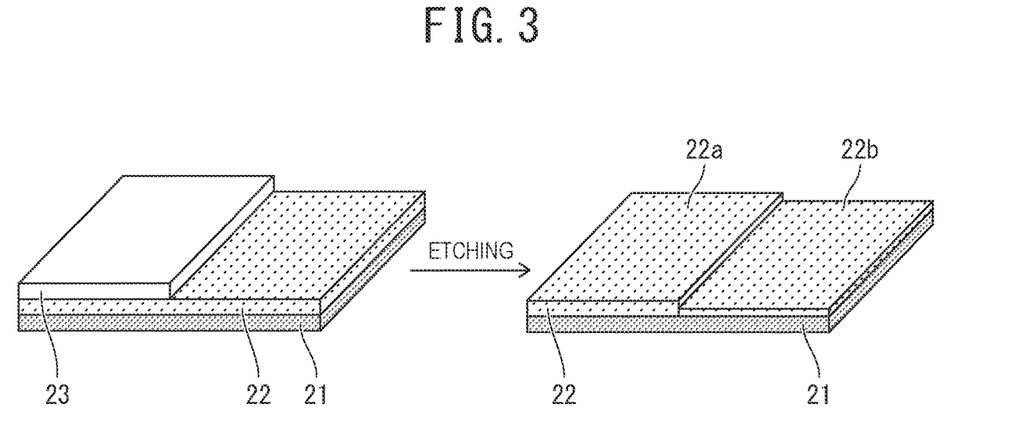
FIG. 3 is a diagram illustrative of test pieces used in examples, comparative examples, and reference examples.

A square silicon substrate 21 of 2 inches per side having a titanium oxide ($TiO_2$) film 22 with a film thickness of 517 nm deposited thereon (manufactured by KST World Corporation) was prepared, and a rectangular nickel substrate 23 with dimensions of 1 inch×2 inches was bonded onto the titanium oxide film 22 by using grease (Demnum Grease L-200 manufactured by Daikin Industries, Ltd.) to create the test piece. The nickel substrate 23 was bonded so as to cover substantially half of the titanium oxide film 22 as illustrated in FIG. 3.

The test piece was placed on a stage inside a chamber of the etching apparatus, and the temperature of the stage was increased to 150° C. Subsequently, a bromine pentafluoride gas of a flow rate of 50 mL/min and argon of a flow rate of 450 mL/min were mixed to form a mixed gas, and this mixed gas was used as the etching gas. Then, the etching gas was supplied into the chamber at a flow rate of 500 mL/min and circulated for 10 minutes to perform etching. Thus, an exposed portion of the titanium oxide film 22 that was not covered by the nickel substrate 23 was etched. The pressure inside the chamber during the circulation of the etching gas was set to 10 kPa, and the partial pressure of the bromine pentafluoride gas was set to 1 kPa. Upon completion of the circulation of the etching gas, the heating of the stage was finished, and the inside of the chamber was replaced with argon.

When the etching was finished, the chamber was opened, the test piece was taken out, the nickel substrate 23 was removed from the test piece that had been taken out, and the bonded surface was cleaned with ethanol to remove the grease. Then, using an atomic force microscope VN-8010 manufactured by Keyence Corporation, the size of the step between a covered surface 22a of the titanium oxide film 22 which was covered by the nickel substrate 23 and was not etched, and an etched surface 22b of the titanium oxide film 22 which was not covered by the nickel substrate 23 and was etched was measured. The etching rate (nm/min) was calculated by dividing the measured size of the step (nm) by the etching time (min). The result is shown in Table 1.

The conditions for measuring the size of the step by the atomic force microscope are as follows.

Measurement pressure: Atmospheric pressure (101.3 kPa)

Measurement temperature: 28° C.

Measurement atmosphere: In the atmosphere

Scanning range: Width 80.0 μm, Height 20.0 μm, and angle 0°

TABLE 1

| | Etching object | Non-etching object | Etching gas | | | | Temp. of stage (° C.) | Pressure in chamber (kPa) | Etching rate (nm/min) |
|---|---|---|---|---|---|---|---|---|---|
| | | | Halogen fluoride | Inert gas | Halogen simple substance gas | Volume ratio*) | | | |
| Example 1-1 | Titanium oxide | — | $BrF_5$ | Ar | — | 10/90/0 | 150 | 10 | 20 |
| Example 1-2 | Titanium oxide | — | $IF_7$ | Ar | — | 10/90/0 | 150 | 10 | 18 |
| Example 1-3 | Titanium oxide | — | $BrF_5$ | Ar | — | 10/90/0 | 50 | 10 | 5 |
| Example 1-4 | Titanium oxide | — | $IF_7$ | Ar | — | 10/90/0 | 50 | 10 | 3 |
| Example 1-5 | Titanium oxide | — | $BrF_5$ | Ar | $F_2$ | 10/85/5 | 150 | 10 | 8 |
| Example 1-6 | Titanium oxide | — | $BrF_5$ | Ar | $Br_2$ | 10/85/5 | 150 | 10 | 9 |
| Example 1-7 | Titanium oxide | — | $IF_7$ | Ar | $I_2$ | 10/85/5 | 150 | 10 | 7 |
| Comparative example 1-1 | Titanium oxide | — | — | Ar | $F_2$ | 0/90/10 | 150 | 10 | less than 0.1 |

*)Volume ratio of halogen fluoride gas, inert gas, and halogen simple substance gas, e.g., "halogen fluoride gas:inert gas:halogen simple substance gas = 10:90:0" is denoted by "10/90/0"

Example 1-2

A test piece was etched in the same manner as in Example 1-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the titanium oxide was calculated. The result is shown in Table 1.

Example 1-3

A test piece was etched in the same manner as in Example 1-1 except that the temperature of the stage was set to 50°

C., and then the etching rate of the titanium oxide was calculated. The result is shown in Table 1.

Example 1-4

A test piece was etched in the same manner as in Example 1-1 except that iodine heptafluoride was used as the halogen fluoride, a mixed gas formed by mixing an iodine heptafluoride gas of a flow rate of 50 mL/min and argon of a flow rate of 450 mL/min was used as the etching gas, and the temperature of the stage was set to 50° C., and then the etching rate of the titanium oxide was calculated. The result is shown in Table 1.

Example 1-5

A test piece was etched in the same manner as in Example 1-1 except that an etching apparatus having substantially the same configuration as that of the etching apparatus of FIG. 2 was used, and the etching was performed using an etching gas that contained a halogen simple substance gas, and then the etching rate of the titanium oxide was calculated. The result is shown in Table 1. The used etching gas is a mixed gas formed by mixing a bromine pentafluoride gas of a flow rate of 50 mL/min, a fluorine gas ($F_2$ gas) of a flow rate of 25 mL/min, and argon of a flow rate of 425 mL/min.

Example 1-6

A test piece was etched in the same manner as in Example 1-5 except that a mixed gas formed by mixing a bromine pentafluoride gas of a flow rate of 50 mL/min, a bromine gas of a flow rate of 25 mL/min, and argon of a flow rate of 425 mL/min was used as the etching gas, and then the etching rate of the titanium oxide was calculated. The result is shown in Table 1.

Example 1-7

A test piece was etched in the same manner as in Example 1-5 except that a mixed gas formed by mixing an iodine heptafluoride gas of a flow rate of 50 mL/min, an iodine gas of a flow rate of 25 mL/min, and argon of a flow rate of 450 mL/min was used as the etching gas, and then the etching rate of the titanium oxide was calculated. The result is shown in Table 1.

Comparative Example 1-1

A test piece was etched in the same manner as in Example 1-1 except that a mixed gas formed by mixing a fluorine gas ($F_2$ gas) of a flow rate of 50 mL/min and argon of a flow rate of 450 mL/min was used as the etching gas, and then the etching rate of the titanium oxide was calculated. The result is shown in Table 1.

Example 2-1

A test piece was fabricated (refer to FIG. 3) in the same manner as in Example 1-1 except that a piece in which a titanium nitride (TiN) film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 130° C., and then the etching rate of the titanium nitride was calculated. The result is shown in Table 2.

TABLE 2

| | | | Etching gas | | | | | | |
|---|---|---|---|---|---|---|---|---|---|
| | Etching object | Non-etching object | Halogen fluoride | Inert gas | Halogen simple substance gas | Volume ratio*) | Temp. of stage (° C.) | Pressure in chamber (kPa) | Etching rate (nm/min) |
| Example 2-1 | Titanium nitride | — | $BrF_5$ | Ar | — | 10/90/0 | 130 | 10 | 25 |
| Example 2-2 | Titanium nitride | — | $IF_7$ | Ar | — | 10/90/0 | 130 | 10 | 20 |
| Example 2-3 | Titanium nitride | — | $BrF_5$ | Ar | — | 10/90/0 | 130 | 3 | 12 |
| Example 2-4 | Titanium nitride | — | $IF_7$ | Ar | — | 10/90/0 | 130 | 3 | 7 |
| Example 2-5 | Titanium nitride | — | $BrF_5$ | Ar | — | 10/90/0 | 130 | 50 | 14 |
| Example 2-6 | Titanium nitride | — | $IF_7$ | Ar | — | 10/90/0 | 130 | 50 | 10 |
| Comparative Example 2-1 | Titanium nitride | — | — | Ar | $F_2$ | 0/90/10 | 130 | 10 | less than 0.1 |

*)Volume ratio of halogen fluoride gas, inert gas, and halogen simple substance gas, e.g., "halogen fluoride gas:inert gas:halogen simple substance gas = 10:90:0" is denoted by "10/90/0"

Example 2-2

A test piece was etched in the same manner as in Example 2-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the titanium nitride was calculated. The result is shown in Table 2.

Example 2-3

A test piece was etched in the same manner as in Example 2-1 except that the pressure in the chamber was set to 3 kPa, and then the etching rate of the titanium nitride was calculated. The result is shown in Table 2.

Example 2-4

A test piece was etched in the same manner as in Example 2-2 except that the pressure in the chamber was set to 3 kPa, and then the etching rate of the titanium nitride was calculated. The result is shown in Table 2.

Example 2-5

A test piece was etched in the same manner as in Example 2-1 except that the pressure in the chamber was set to 50 kPa, and then the etching rate of the titanium nitride was calculated. The result is shown in Table 2.

Example 2-6

A test piece was etched in the same manner as in Example 2-2 except that the pressure in the chamber was set to 50 kPa, and then the etching rate of the titanium nitride was calculated. The result is shown in Table 2.

Comparative Example 2-1

A test piece was etched in the same manner as in Example 2-1 except that a mixed gas formed by mixing a fluorine gas ($F_2$ gas) of a flow rate of 50 mL/min and argon of a flow rate of 450 mL/min was used as the etching gas, and then the etching rate of the titanium nitride was calculated. The result is shown in Table 2.

Example 3-1

A square silicon substrate of 2 inches per side having a copper (Cu) film with a film thickness of 500 nm deposited thereon was prepared as a test piece. Both the test piece having the copper film and the test piece used in Example 2-1 were used as the members to be etched, and the test pieces were etched in the same manner as in Example 2-1 except that these two test pieces were placed side by side on the stage in the chamber, and then the etching rates of the titanium nitride, which is an etching object, and the copper, which is a non-etching object, were calculated. The results are shown in Table 3.

TABLE 3

| | | | Etching gas | | | | | | Etching rate (nm/min) | |
|---|---|---|---|---|---|---|---|---|---|---|
| | Etching object | Non-etching object | Halogen fluoride | Inert gas | Halogen simple substance gas | Volume ratio*) | Temp. of stage (° C.) | Pressure in chamber (kPa) | Etching object | Non-etching object |
| Example 3-1 | Titanium nitride | Copper | $BrF_5$ | Ar | — | 10/90/0 | 130 | 10 | 20 | less than 0.1 |
| Example 3-2 | Titanium nitride | Copper | $IF_7$ | Ar | — | 10/90/0 | 130 | 10 | 20 | less than 0.1 |
| Example 3-3 | Titanium nitride | Nickel | $BrF_5$ | Ar | — | 10/90/0 | 130 | 10 | 24 | less than 0.1 |
| Example 3-4 | Titanium nitride | Nickel | $IF_7$ | Ar | — | 10/90/0 | 130 | 10 | 22 | less than 0.1 |
| Example 3-5 | Titanium nitride | Cobalt | $BrF_5$ | Ar | — | 10/90/0 | 130 | 10 | 24 | less than 0.1 |
| Example 3-6 | Titanium nitride | Cobalt | $IF_7$ | Ar | — | 10/90/0 | 130 | 10 | 20 | less than 0.1 |
| Example 3-7 | Titanium nitride | Photoresist | $BrF_5$ | Ar | — | 10/90/0 | 130 | 10 | 22 | less than 0.1 |
| Example 3-8 | Titanium nitride | Photoresist | $IF_7$ | Ar | — | 10/90/0 | 130 | 10 | 21 | 1.2 |
| Comparative example 3-1 | Titanium nitride | Copper | — | Ar | $F_2$ | 0/90/10 | 130 | 10 | less than 0.1 | less than 0.1 |
| Comparative example 3-2 | Titanium nitride | Nickel | — | Ar | $F_2$ | 0/90/10 | 130 | 10 | less than 0.1 | less than 0.1 |
| Comparative example 3-3 | Titanium nitride | Cobalt | — | Ar | $F_2$ | 0/90/10 | 130 | 10 | less than 0.1 | less than 0.1 |
| Comparative example 3-4 | Titanium nitride | Photoresist | — | Ar | $F_2$ | 0/90/10 | 130 | 10 | less than 0.1 | 1 |

*)Volume ratio of halogen fluoride gas, inert gas, and halogen simple substance gas, e.g., "halogen fluoride gas:inert gas:halogen simple substance gas = 10:90:0" is denoted by "10/90/0"

Example 3-2

Test pieces were etched in the same manner as in Example 3-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rates of the titanium nitride and the copper were calculated. The results are shown in Table 3.

Example 3-3

A square silicon substrate of 2 inches per side having a nickel (Ni) film with a film thickness of 500 nm deposited thereon was prepared as a test piece. Both the test piece having the nickel film and the test piece used in Example 2-1 were used as the members to be etched, and the test pieces were etched in the same manner as in Example 2-1 except that the two test pieces were placed side by side on the stage in the chamber, and then the etching rates of the titanium nitride, which is an etching object, and the nickel, which is a non-etching object, were calculated. The results are shown in Table 3.

Example 3-4

Test pieces were etched in the same manner as in Example 3-3 except that iodine heptafluoride was used as the halogen fluoride, and a mixed gas formed by mixing an iodine pentafluoride gas of a flow rate of 50 mL/min and argon of a flow rate of 450 mL/min was used as the etching gas, and then the etching rates of the titanium nitride and the nickel were calculated. The results are shown in Table 3.

Example 3-5

A square silicon substrate of 2 inches per side having a cobalt (Co) film with a film thickness of 500 nm deposited thereon was prepared as a test piece. Both the test piece having the cobalt film and the test piece used in Example 2-1 were used as the members to be etched, and the test pieces were etched in the same manner as in Example 2-1 except that the two test pieces were placed side by side on the stage in the chamber, and then the etching rates of the titanium nitride, which is an etching object, and the cobalt, which is a non-etching object, were calculated. The results are shown in Table 3.

Example 3-6

Test pieces were etched in the same manner as in Example 3-5 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rates of the titanium nitride and the cobalt were calculated. The results are shown in Table 3.

Example 3-7

A photoresist (TSCR (registered trademark) manufactured by Tokyo Ohka Kogyo Co., Ltd.) was applied to a square silicon substrate of 2 inches per side, and exposed and cured to form a photoresist film having a film thickness of 1000 nm, thus preparing a test piece. Both the test piece having the photoresist film and the test piece used in Example 2-1 were used as the members to be etched, and the test pieces were etched in the same manner as in Example 2-1 except that the two test pieces were placed side by side on the stage in the chamber, and then the etching rates of the titanium nitride, which is an etching object, and the photoresist, which is a non-etching object, were calculated. The results are shown in Table 3.

Example 3-8

Test pieces were etched in the same manner as in Example 3-7 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rates of the titanium nitride and the photoresist were calculated. The results are shown in Table 3.

Comparative Example 3-1

Test pieces were etched in the same manner as in Example 3-1 except that a mixed gas formed by mixing a fluorine gas of a flow rate of 50 mL/min and argon of a flow rate of 450 mL/min was used as the etching gas, and then the etching rates of the titanium nitride and the copper were calculated. The results are shown in Table 3.

Comparative Example 3-2

Test pieces were etched in the same manner as in Example 3-3 except that a mixed gas formed by mixing a fluorine gas of a flow rate of 50 mL/min and argon of a flow rate of 450 mL/min was used as the etching gas, and then the etching rates of the titanium nitride and the nickel were calculated. The results are shown in Table 3.

Comparative Example 3-3

Test pieces were etched in the same manner as in Example 3-5 except that a mixed gas formed by mixing a fluorine gas of a flow rate of 50 mL/min and argon of a flow rate of 450 mL/min was used as the etching gas, and then the etching rates of the titanium nitride and the cobalt were calculated. The results are shown in Table 3.

Comparative Example 3-4

Test pieces were etched in the same manner as in Example 3-7 except that a mixed gas formed by mixing a fluorine gas of a flow rate of 50 mL/min and argon of a flow rate of 450 mL/min was used as the etching gas, and then the etching rates of the titanium nitride and the photoresist were calculated. The results are shown in Table 3.

Example 4-1

A test piece was fabricated (refer to FIG. 3) in the same manner as in Example 1-1 except that a piece in which a titanium oxynitride film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 100° C., and then the etching rate of the titanium oxynitride was calculated. The result is shown in Table 4.

TABLE 4

| | Etching object | Non-etching object | Etching gas Halogen fluoride | Inert gas | Halogen simple substance gas | Volume ratio[*] | Temp. of stage (° C.) | Pressure in chamber (kPa) | Etching rate (nm/min) |
|---|---|---|---|---|---|---|---|---|---|
| Example 4-1 | Titanium oxynitride | — | BrF$_5$ | Ar | — | 10/90/0 | 100 | 10 | 22 |
| Example 4-2 | Titanium oxynitride | — | IF$_7$ | Ar | — | 10/90/0 | 100 | 10 | 20 |
| Comparative example 4-1 | Titanium oxynitride | — | — | Ar | F$_2$ | 0/90/10 | 100 | 10 | less than 0.1 |
| Example 5-1 | Titanium oxyfluoride | — | BrF$_5$ | Ar | — | 10/90/0 | 100 | 10 | 16 |
| Example 5-2 | Titanium oxyfluoride | — | IF$_7$ | Ar | — | 10/90/0 | 100 | 10 | 19 |
| Comparative example 5-1 | Titanium oxyfluoride | — | — | Ar | F$_2$ | 0/90/10 | 100 | 10 | less than 0.1 |
| Example 6-1 | Titanium | — | BrF$_5$ | Ar | — | 10/90/0 | 80 | 10 | 14 |
| Example 6-2 | Titanium | — | IF$_7$ | Ar | — | 10/90/0 | 80 | 10 | 10 |
| Comparative example 6-1 | Titanium | — | — | Ar | F$_2$ | 0/90/10 | 80 | 10 | less than 0.1 |

[*]Volume ratio of halogen fluoride gas, inert gas, and halogen simple substance gas, e.g., "halogen fluoride gas:inert gas:halogen simple substance gas = 10:90:0" is denoted by "10/90/0"

Example 4-2

A test piece was etched in the same manner as in Example 4-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the titanium oxynitride was calculated. The result is shown in Table 4.

Comparative Example 4-1

A test piece was etched in the same manner as in Example 4-1 except that a mixed gas formed by mixing a fluorine gas of a flow rate of 50 mL/min and argon of a flow rate of 450 mL/min was used as the etching gas, and then the etching rate of the titanium oxynitride was calculated. The result is shown in Table 4.

Example 5-1

A test piece was fabricated (refer to FIG. 3) in the same manner as in Example 1-1 except that a piece in which a titanium oxyfluoride film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 100° C., and then the etching rate of the titanium oxyfluoride was calculated. The result is shown in Table 4.

Example 5-2

A test piece was etched in the same manner as in Example 5-1 except that iodine heptafluoride was used as the halogen fluoride, and a mixed gas formed by mixing an iodine pentafluoride gas of a flow rate of 50 mL/min and argon of a flow rate of 450 mL/min was used as the etching gas, and then the etching rate of the titanium oxyfluoride was calculated. The result is shown in Table 4.

Comparative Example 5-1

A test piece was etched in the same manner as in Example 5-1 except that a mixed gas formed by mixing a fluorine gas of a flow rate of 50 mL/min and argon of a flow rate of 450 mL/min was used as the etching gas, and then the etching rate of the titanium oxyfluoride was calculated. The result is shown in Table 4.

Example 6-1

A test piece was fabricated (refer to FIG. 3) in the same manner as in Example 1-1 except that a piece in which a titanium (Ti) film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 80° C., and then the etching rate of the titanium was calculated. The result is shown in Table 4.

Example 6-2

A test piece was etched in the same manner as in Example 6-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the titanium was calculated. The result is shown in Table 4.

Comparative Example 6-1

A test piece was etched in the same manner as in Example 6-1 except that a mixed gas formed by mixing a fluorine gas of a flow rate of 50 mL/min and argon of a flow rate of 450 mL/min was used as the etching gas, and then the etching rate of the titanium was calculated. The result is shown in Table 4.

Example 7-1

A test piece was fabricated (refer to FIG. 3) in the same manner as in Example 1-1 except that a piece in which a tin oxide (SnO$_2$) film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 160° C., and then the etching rate of the tin oxide was calculated. The result is shown in Table 5.

TABLE 5

| | | | Etching gas | | | | | | |
|---|---|---|---|---|---|---|---|---|---|
| | Etching object | Non-etching object | Halogen fluoride | Inert gas | Halogen simple substance gas | Volume ratio*) | Temp. of stage (° C.) | Pressure in chamber (kPa) | Etching rate (nm/min) |
| Example 7-1 | Tin oxide | — | $BrF_5$ | Ar | — | 10/90/0 | 160 | 10 | 7 |
| Example 7-2 | Tin oxide | — | $IF_7$ | Ar | — | 10/90/0 | 160 | 10 | 12 |
| Example 7-3 | Tin oxide | — | $BrF_5$ | Ar | — | 10/90/0 | 250 | 10 | 12 |
| Example 7-4 | Tin oxide | — | $IF_7$ | Ar | — | 10/90/0 | 250 | 10 | 17 |
| Comparative example 7-1 | Tin oxide | — | — | Ar | $F_2$ | 0/90/10 | 250 | 10 | less than 0.1 |
| Example 8-1 | Indium oxide | — | $BrF_5$ | Ar | — | 10/90/0 | 160 | 10 | 13 |
| Example 8-2 | Indium oxide | — | $IF_7$ | Ar | — | 10/90/0 | 160 | 10 | 13 |
| Comparative example 8-1 | Indium oxide | — | — | Ar | $F_2$ | 0/90/10 | 160 | 10 | less than 0.1 |
| Example 9-1 | Indium tin oxide | — | $BrF_5$ | Ar | — | 10/90/0 | 160 | 10 | 15 |
| Example 9-2 | Indium tin oxide | — | $IF_7$ | Ar | — | 10/90/0 | 160 | 10 | 16 |
| Comparative example 9-1 | Indium tin oxide | — | — | Ar | $F_2$ | 0/90/10 | 160 | 10 | less than 0.1 |

*)Volume ratio of halogen fluoride gas, inert gas, and halogen simple substance gas, e.g., "halogen fluoride gas:inert gas:halogen simple substance gas = 10:90:0" is denoted by "10/90/0"

Example 7-2

A test piece was etched in the same manner as in Example 7-1 except that iodine heptafluoride was used as the halogen fluoride, and a mixed gas formed by mixing an iodine pentafluoride gas of a flow rate of 50 mL/min and argon of a flow rate of 450 mL/min was used as the etching gas, and then the etching rate of the tin oxide was calculated. The result is shown in Table 5.

Example 7-3

A test piece was etched in the same manner as in Example 7-1 except that the temperature of the stage was set to 250° C., and then the etching rate of the tin oxide was calculated. The result is shown in Table 5.

Example 7-4

A test piece was etched in the same manner as in Example 7-2 except that the temperature of the stage was set to 250° C., and then the etching rate of the tin oxide was calculated. The result is shown in Table 5.

Comparative Example 7-1

A test piece was etched in the same manner as in Example 7-3 except that a mixed gas formed by mixing a fluorine gas of a flow rate of 50 mL/min and argon of a flow rate of 450 mL/min was used as the etching gas, and then the etching rate of the tin oxide was calculated. The result is shown in Table 5.

Example 8-1

A test piece was fabricated (refer to FIG. 3) in the same manner as in Example 1-1 except that apiece in which an indium oxide ($In_2O_3$) film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 160° C., and then the etching rate of the indium oxide was calculated. The result is shown in Table 5.

Example 8-2

A test piece was etched in the same manner as in Example 8-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the indium oxide was calculated. The result is shown in Table 5.

Comparative Example 8-1

A test piece was etched in the same manner as in Example 8-1 except that a mixed gas formed by mixing a fluorine gas of a flow rate of 50 mL/min and argon of a flow rate of 450 mL/min was used as the etching gas, and then the etching rate of the indium oxide was calculated. The result is shown in Table 5.

Example 9-1

A test piece was fabricated (refer to FIG. 3) in the same manner as in Example 1-1 except that apiece in which an indium tin oxide film having a film thickness of 500 nm instead of the titanium oxide film 22 is deposited on the silicon substrate 21 was used (the piece being manufactured by KST World Corporation). Then, the test piece was etched in the same manner as in Example 1-1 except that the temperature of the stage was set to 160° C., and then the etching rate of the indium tin oxide was calculated. The result is shown in Table 5.

Example 9-2

A test piece was etched in the same manner as in Example 9-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the indium tin oxide was calculated. The result is shown in Table 5.

Comparative Example 9-1

A test piece was etched in the same manner as in Example 9-1 except that a mixed gas formed by mixing a fluorine gas of a flow rate of 50 mL/min and argon of a flow rate of 450 mL/min was used as the etching gas, and then the etching rate of the indium tin oxide was calculated. The result is shown in Table 5.

Reference Example 1-1

A test piece that is the same as the test piece having the nickel film used in Example 3-3 was prepared. Then, the test piece was etched in the same manner as in Example 1-1 except that the temperature of the stage was set to 250° C., and then the etching rate of the nickel was calculated. The result is shown in Table 6.

Reference Example 3-1

A test piece that is the same as the test piece having the copper film used in Example 3-1 was prepared. Then, the test piece was etched in the same manner as in Example 1-1 except that the temperature of the stage was set to 120° C., and then the etching rate of the copper was calculated. The result is shown in Table 6.

Reference Example 3-2

A test piece was etched in the same manner as in Reference example 3-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the copper was calculated. The result is shown in Table 6.

TABLE 6

| | Etching object | Non-etching object | Etching gas | | | | Temp. of stage (° C.) | Pressure in chamber (kPa) | Etching rate (nm/min) |
|---|---|---|---|---|---|---|---|---|---|
| | | | Halogen fluoride | Inert gas | Halogen simple substance gas | Volume ratio*) | | | |
| Reference example 1-1 | — | Nickel | BrF$_5$ | Ar | — | 10/90/0 | 250 | 10 | less than 0.1 |
| Reference example 1-2 | — | Nickel | IF$_7$ | Ar | — | 10/90/0 | 250 | 10 | less than 0.1 |
| Reference example 2-1 | — | Cobalt | BrF$_5$ | Ar | — | 10/90/0 | 250 | 10 | less than 0.1 |
| Reference example 2-2 | — | Cobalt | IF$_7$ | Ar | — | 10/90/0 | 250 | 10 | less than 0.1 |
| Reference example 3-1 | — | Copper | BrF$_5$ | Ar | — | 10/90/0 | 120 | 10 | less than 0.1 |
| Reference example 3-2 | — | Copper | IF$_7$ | Ar | — | 10/90/0 | 120 | 10 | less than 0.1 |
| Reference example 4-1 | — | Photoresist | BrF$_5$ | Ar | — | 10/90/0 | 120 | 10 | less than 0.1 |
| Reference example 4-2 | — | Photoresist | IF$_7$ | Ar | — | 10/90/0 | 100 | 10 | less than 0.1 |
| Reference example 4-3 | — | Photoresist | BrF$_5$ | Ar | F$_2$ | 10/85/5 | 120 | 10 | 3 |

*)Volume ratio of halogen fluoride gas, inert gas, and halogen simple substance gas, e.g., "halogen fluoride gas:inert gas:halogen simple substance gas = 10:90:0" is denoted by "10/90/0"

Reference Example 1-2

A test piece was etched in the same manner as in Reference example 1-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the nickel was calculated. The result is shown in Table 6.

Reference Example 2-1

A test piece that is the same as the test piece having the cobalt film used in Example 3-5 was prepared. Then, the test piece was etched in the same manner as in Example 1-1 except that the temperature of the stage was set to 250° C., and then the etching rate of the cobalt was calculated. The result is shown in Table 6.

Reference Example 2-2

A test piece was etched in the same manner as in Reference example 2-1 except that iodine heptafluoride was used as the halogen fluoride, and a mixed gas formed by mixing an iodine heptafluoride gas of a flow rate of 50 mL/min and argon of a flow rate of 450 mL/min was used as the etching gas, and then the etching rate of the cobalt was calculated. The result is shown in Table 6.

Reference Example 4-1

A test piece that is the same as the test piece having the photoresist film used in Example 3-7 was prepared. Then, the test piece was etched in the same manner as in Example 1-1 except that the temperature of the stage was set to 120° C., and then the etching rate of the photoresist was calculated. The result is shown in Table 6.

Reference Example 4-2

A test piece was etched in the same manner as in Reference example 4-1 except that iodine heptafluoride was used as the halogen fluoride, a mixed gas formed by mixing an iodine heptafluoride gas of a flow rate of 50 mL/min and argon of a flow rate of 450 mL/min was used as the etching gas, and the temperature of the stage was set to 100° C., and then the etching rate of the photoresist was calculated. The result is shown in Table 6.

Reference Example 4-3

A test piece was etched in the same manner as in Reference example 4-1 except that a mixed gas formed by mixing a bromine pentafluoride gas of a flow rate of 50 mL/min, a fluorine gas of a flow rate of 25 mL/min, and argon of a flow rate of 425 mL/min was used as the etching gas, and then the etching rate of the photoresist was calculated. The result is shown in Table 6.

As indicated in Example 1-1 to Example 1-4, using the etching gas that contains bromine pentafluoride or iodine heptafluoride made it possible to etch the titanium oxide. Further, in Example 1-5 to Example 1-7, in which the etching gas that contains 5% by volume of the halogen simple substance gas was used, the etching rate of the titanium oxide was slightly lower than that in Example 1-1 and Example 1-2. On the other hand, in Comparative example 1-1, in which the mixed gas of a fluorine gas and argon was used as the etching gas, the etching of the titanium oxide did not progress. This is presumed to be because the halogen simple substance gas reacted with the titanium oxide, forming a passive film.

As indicated in Example 2-1 to Example 2-6, using the etching gas containing bromine pentafluoride or iodine heptafluoride caused the etching of the titanium nitride to progress. On the other hand, in Comparative example 2-1, in which the mixed gas of the fluorine gas and argon was used as the etching gas, the etching of the titanium nitride did not progress.

As indicated in Example 3-1 to Example 3-8, when the titanium nitride, which is the etching object, and the copper, the nickel, the cobalt, or the photoresist, which is the non-etching object, were simultaneously etched using the etching gas containing the bromine pentafluoride or iodine heptafluoride, only the titanium nitride, which is the etching object, was selectively etched, and the non-etching object was hardly etched. On the other hand, in Comparative example 3-1 to Comparative example 3-4, in which the mixed gas of the fluorine gas and argon was used as the etching gas, the etching of the etching object as well as the non-etching object hardly progressed.

As indicated in Examples 4-1, 4-2, 5-1, 5-2, 6-1, 6-2, 7-1, 7-2, 7-3, 7-4, 8-1, 8-2, 9-1, and 9-2, using the etching gas that contains bromine pentafluoride or iodine heptafluoride enabled the etching of the titanium oxynitride, the titanium oxyfluoride, the titanium, the tin oxide, the indium oxide, and the indium tin oxide. On the other hand, in Comparative example 4-1 to Comparative example 9-1, in which the mixed gas of the fluorine gas and argon was used as the etching gas, the etching of any of the etching objects hardly progressed.

As indicated in Reference examples 1-1, 1-2, 2-1, 2-2, 3-1, 3-2, 4-1, and 4-2, even when the etching gas containing bromine pentafluoride or iodine heptafluoride was used, the nickel, the cobalt, the copper, and the photoresist were hardly etched. From these results, it is seen that performing the etching in the above-described examples makes it possible to selectively etch titanium oxide, titanium nitride, titanium oxynitride, titanium oxyfluoride, titanium, tin oxide, indium oxide, and indium tin oxide without etching nickel, cobalt, copper, and photoresist, which are non-etching objects.

On the other hand, as indicated in Reference example 4-3, when the mixed gas containing a fluorine gas was used as the etching gas, the etching of the photoresist slightly progressed. This suggested that the etching selectivity between an etching object and a non-etching object is influenced if the etching gas contains the halogen simple substance gas.

REFERENCE SIGNS LIST 1 halogen fluoride gas supply unit
2 inert gas supply unit
3 halogen fluoride gas flow rate control unit
4 inert gas flow rate control unit
5 halogen fluoride gas supply pipe
6 inert gas supply pipe
7, 16 pressure gauge
8 inert gas pressure control unit
10 chamber
11 stage
12 member to be etched
13 exhaust pipe
14 thermometer
15 vacuum pump
17 halogen simple substance gas supply unit
18 halogen simple substance gas flow rate control unit
19 halogen simple substance gas supply pipe
21 silicon substrate
22 titanium oxide film
23 nickel substrate

The invention claimed is:

1. A dry etching method comprising:
dry etching in which an etching gas containing a halogen fluoride, the halogen fluoride being bromine fluoride or iodine fluoride, is brought into contact with a member to be etched having an etching object, the etching object being an object to be etched by the etching gas, to etch the etching object without using plasma,
wherein the etching object contains at least one metal selected from the group consisting of indium and tin,
wherein a content of a halogen simple substance gas contained in the etching gas is less than 5% by volume, and
wherein a content of the halogen fluoride contained in the etching gas is 10% by volume or more.

2. The dry etching method according to claim 1,
wherein the halogen fluoride is at least one selected from the group consisting of bromine monofluoride, bromine trifluoride, bromine pentafluoride, iodine pentafluoride, and iodine heptafluoride.

3. The dry etching method according to claim 2,
wherein the etching gas is a mixed gas containing the halogen fluoride and an inert gas.

4. The dry etching method according to claim 2,
wherein the dry etching is performed under a temperature condition of 40° C. to 250° C.

5. The dry etching method according to claim 2,
wherein the dry etching is performed under a temperature condition of 80° C. to 150° C.

6. The dry etching method according to claim 1,
wherein the etching gas is a mixed gas containing the halogen fluoride and an inert gas.

7. The dry etching method according to claim 6,
wherein the dry etching is performed under a temperature condition of 40° C. to 250° C.

8. The dry etching method according to claim 6,
wherein the dry etching is performed under a temperature condition of 80° C. to 150° C.

9. The dry etching method according to claim 1,
wherein the dry etching is performed under a temperature condition of 40° C. to 250° C.

10. The dry etching method according to claim 1,
wherein the dry etching is performed under a temperature condition of 80° C. to 150° C.

11. The dry etching method according to claim 1,
wherein the dry etching is performed under a pressure condition of 1 Pa to 100 kPa.

12. The dry etching method according to claim 1,
wherein the member to be etched has a non-etching object, the non-etching object being not an object to be etched by the etching gas, and the etching object, the non-etching object has at least one selected from the group consisting of copper, nickel, cobalt, and photoresist, and the etching object is selectively etched against the non-etching object.

13. The dry etching method according to claim 1, wherein the etching object is at least one selected from the group consisting of a simple substance of the metal, an oxide of the metal, a nitride of the metal, an oxynitride of the metal, and an oxyfluoride of the metal.

14. A production method for a semiconductor element for manufacturing a semiconductor element by using the dry etching method according to claim 1, wherein the member to be etched is a semiconductor substrate having the etching object, and the production method includes processing in which at least a part of the etching object is removed from the semiconductor substrate by the etching.

15. A cleaning method for cleaning an inner surface of a chamber of a semiconductor element manufacturing apparatus by using the dry etching method according to claim 1, wherein the member to be etched is the chamber, the chamber has, on its inner surface, a deposit adhering due to an operation of the semiconductor element manufacturing apparatus, and the deposit is the etching object, and the cleaning method includes cleaning for removing the deposit from the inner surface of the chamber by the etching.

* * * * *